(12) United States Patent
Roy et al.

(10) Patent No.: US 10,153,312 B2
(45) Date of Patent: Dec. 11, 2018

(54) BACK-SIDE ILLUMINATED PIXEL

(71) Applicant: STMicroelectronics (Crolles 2) SAS, Crolles (FR)

(72) Inventors: François Roy, Seyssins (FR); Helene Wehbe-Alause, Grenoble (FR); Olivier Noblanc, Grenoble (FR)

(73) Assignee: STMICROELECTRONICS (CROLLES 2) SAS, Crolles (FR)

(*) Notice: Subject to any disclaimer, the term of this patent is extended or adjusted under 35 U.S.C. 154(b) by 0 days.

(21) Appl. No.: 15/790,432

(22) Filed: Oct. 23, 2017

(65) Prior Publication Data

US 2018/0047770 A1 Feb. 15, 2018

Related U.S. Application Data

(63) Continuation of application No. 15/096,033, filed on Apr. 11, 2016, now Pat. No. 9,825,076.

(30) Foreign Application Priority Data

Dec. 28, 2015 (FR) ...................................... 15 63379

(51) Int. Cl.
*H01L 27/146* (2006.01)
*H01L 27/12* (2006.01)

(52) U.S. Cl.
CPC .... *H01L 27/14612* (2013.01); *H01L 27/1203* (2013.01); *H01L 27/1463* (2013.01); *H01L 27/1464* (2013.01); *H01L 27/14643* (2013.01); *H01L 27/14645* (2013.01); *H01L 27/14687* (2013.01); *H01L 27/14689* (2013.01)

(58) Field of Classification Search
CPC ............. H01L 27/1463; H01L 27/1464; H01L 27/14689; H01L 27/14643
USPC ........ 257/292, E27.133, 291, 447; 250/208.1
See application file for complete search history.

(56) References Cited

U.S. PATENT DOCUMENTS

| 8,513,761 B2 | 8/2013 | Roy et al. | |
|---|---|---|---|
| 2010/0193845 A1* | 8/2010 | Roy | H01L 27/1463 257/228 |
| 2011/0068381 A1* | 3/2011 | Barbier | H01L 27/14609 257/292 |
| 2011/0180689 A1* | 7/2011 | Roy | H01L 27/14603 250/208.1 |
| 2012/0018619 A1* | 1/2012 | Roy | H01L 27/14601 250/208.1 |
| 2015/0279883 A1 | 10/2015 | Manouvrier et al. | |

OTHER PUBLICATIONS

Sze, S. M., *Physics of Semiconductor Devices*, 2d ed., John Wiley & Sons, N.Y., 1981, p. 493. (2 pages).

* cited by examiner

*Primary Examiner* — Jonathan Han
(74) *Attorney, Agent, or Firm* — Seed IP Law Group LLP

(57) ABSTRACT

A back-side illuminated pixel including a semiconductor substrate of a first conductivity type coated, on the front side of the pixel, with a three-layer assembly successively including a first layer of the second conductivity type, an insulating layer, and a second semiconductor layer. The three-layer assembly is interrupted in a central portion of the pixel by a transfer region of the first conductivity type laterally delimited by an insulated conductive wall extending from the front surface, Transistors are formed in the second semiconductor layer.

21 Claims, 3 Drawing Sheets

BACK-SIDE ILLUMINATED PIXEL

BACKGROUND

Technical Field

The present disclosure relates to a back-side illuminated image sensor, that is, an image sensor comprising pixels formed inside and on top of a semiconductor substrate having a first surface, called back side, intended to receive an illumination, and having a second surface, called front side, topped with an interconnection structure, components such as transistors being formed on the front side. The present disclosure also relates to a pixel of such a sensor.

Description of the Related Art

FIG. 1 is a copy of FIG. 1 of U.S. Pat. No. 8,513,761 of the applicant and schematically illustrates an example of a circuit of an image sensor pixel.

The pixel comprises a photodiode D associated with a charge transfer transistor TR, a precharge device, and a read device. The precharge device is formed of an N-channel MOS transistor RST, interposed between a power supply rail Vdd and a sense node S. The read device is formed of the series connection of N-channel MOS transistors SF and RD. The drain of transistor SF is connected to power supply rail Vdd. The source of transistor RD is connected to an input terminal P of a processing circuit (not shown). The gate of read transistor SF, assembled as a source follower, is connected to sense node S. The anode of photodiode D is connected to reference power supply rail GND and the cathode of photodiode D is connected to node S via transistor TR. Generally, the gate control signals of transistors RD, RST, and TR are provided by control circuits, not shown in FIG. 1, and may be provided to all the pixels of a same row of a pixel array. It should be noted that photodiode D is always associated with a transistor TR, but that there may exist a single precharge device and a single read device for a group of photodiodes, the drains of the transfer transistors of these photodiodes then being interconnected to a same node S.

FIG. 2 is a copy of FIG. 5 of U.S. Pat. No. 8,513,761 of the applicant and schematically illustrates an embodiment of a pixel of the type in FIG. 1, FIG. 2 being a cross-section view of this pixel.

The pixel comprises a lightly-doped N-type silicon substrate 11 ($N^-$). An insulating structure comprising an insulated trench (insulator 23) filled with a conductive material 24 connected to a terminal Vwall surrounds the pixel and separates it from the adjacent pixels. A heavily-doped P-type layer 13 ($P^+$) coats substrate 11 on the side of the upper surface, or front side, of the pixel. Layer 13 is interrupted in a substantially central portion of the pixel by a transfer region comprising a lower light-doped N-type portion 17 ($N^-$) and an upper heavily-doped N-type portion 18 ($N^+$). An insulated trench (insulator 15) filled with a conductive material 16 connected to a terminal TG laterally delimits the transfer region. In other words, in top view, not shown, the transfer region is surrounded with insulating structure 15, 16, which is ring shaped, insulating structure 15, 16 being itself surrounded with layer 13. Layer 13 has various transistors, for example, transistors RD, RST, and SF of FIG. 1 (transistor RD is not shown), formed therein. Various metallization levels are formed on the upper surface, or front side, of substrate 11 to provide the connections to the drains, sources, and gates of the various transistors and to $N^+$ region 18 corresponding to sense node S of FIG. 1. A heavily-doped P-type layer 19 ($P^+$) is arranged at the level of the lower surface, or back side, of substrate 11. Further, the lower surface or back side of the pixel is covered with a filter 20 having the desired color for the considered pixel, for example, red, green, or blue. In this example, a lens 21 covers filter 20.

BRIEF SUMMARY

Such a pixel has various disadvantages, particularly in terms of insulation between the transistors and substrate 11 where the photogenerated electrons are stored.

At least one embodiment of the present application is a pixel overcoming at least some of the disadvantages of a pixel of the above-mentioned type.

One embodiment provides a back-side illuminated pixel comprising a semiconductor substrate of a first conductivity type coated, on the front side of the pixel, with a three-layer assembly successively comprising a layer of the second conductivity type, an insulating layer, and a semiconductor layer, the three-layer assembly being interrupted in a central portion of the pixel by a transfer region of the first conductivity type laterally delimited by an insulated conductive wall extending from the front surface, transistors being formed in the semiconductor layer.

According to an embodiment, an insulating structure laterally delimits the pixel.

According to an embodiment, the insulating structure is another insulated conductive wall.

According to an embodiment, the insulating structure extends from the front side to the back side of the substrate.

According to an embodiment, the insulating structure extends from the back side of the substrate all the way into the layer of the second conductivity type.

According to an embodiment, the transfer region comprises an extension of the substrate coated with a heavily-doped region of the first conductivity type.

According to an embodiment, the insulated conductive wall delimiting the transfer region comprises a conductive material bordered with an insulator, the insulator being thicker in an upper portion of the wall bordered with the semiconductor layer, with the insulating layer, and with the heavily-doped region of the first conductivity type.

According to an embodiment, the pixel comprises a contact formed on the layer of the second conductivity type.

According to an embodiment, a heavily-doped layer of the second conductivity type is arranged on the back side of the substrate.

According to an embodiment, the insulated conductive wall delimiting the transfer region is capable of being connected to a first potential to allow a charge transfer through the transfer region, and to a second potential to block this transfer.

An embodiment provides a pixel manufacturing method comprising the steps of:

providing a structure comprising a semiconductor substrate of a first conductivity type coated with an insulating layer itself coated with a semiconductor layer;

masking a central region of the structure and doping the substrate to form a layer of the second conductivity type extending under the insulating layer;

forming, across the entire thickness of the semiconductor layer, of the insulating layer, and of the layer of the second conductivity type, an insulated conductive wall laterally delimiting said central region;

removing by etching portions of the semiconductor layer and of the insulating layer at the level of the central region;

forming transistors in the semiconductor layer;

forming interconnection levels on the upper surface of the semiconductor layer;

attaching a handle above the interconnection levels; and thinning the substrate on its back side.

The foregoing and other features and advantages will be discussed in detail in the following non-limiting description of specific embodiments in connection with the accompanying drawings.

DETAILED DESCRIPTION

Figure 1:
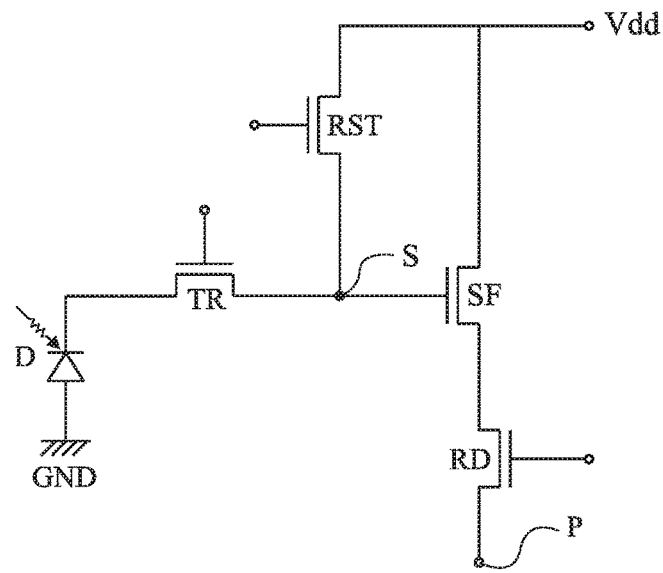
FIG. 1 illustrates an example of a circuit of a pixel.

The same elements have been designated with the same reference numerals in the various drawings and, further, the various drawings are not to scale. For clarity, only those elements which are useful to the understanding of the described embodiments have been shown and are detailed.

In the following description, terms "front", "back", "top", "upper", and "lower" refer to the orientation of the concerned elements in the corresponding drawings. Unless otherwise specified, expressions "substantially", "approximately", and "in the order of" mean to within 10%, preferably to within 5%.

Figure 3:
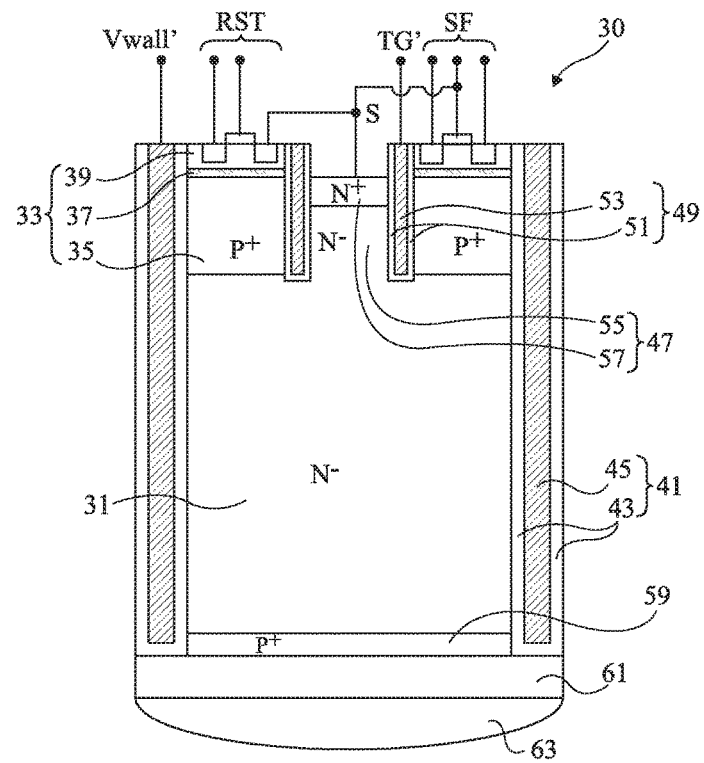
FIG. 3 is a cross-section view of an embodiment of a pixel.

FIG. 3 is a cross-section view of an embodiment of a pixel 30 formed from a SOI structure ("semiconductor on insulator").

Pixel 30 comprises a lightly-doped N-type semiconductor substrate 31 (N⁻). The upper surface, or front side, of substrate 31, is coated with a three-layer assembly 33 successively comprising a heavily-doped P-type layer 35 (P⁺), an insulating layer 37, and a semiconductor layer 39. The pixel is laterally delimited by an insulated conductive wall 41 corresponding to a trench bordered with an insulator 43 and filled with a conductive material 45, conductive material 45 being connected to a terminal Vwall'. In this embodiment, wall 41 extends from the upper surface, or front side, of the structure to the lower surface, or back side, of substrate 31. In a substantially central portion of the pixel, a transfer region 47 is laterally delimited by an insulated conductive wall 49 corresponding to a trench bordered with an insulator 51 and filled with a conductive material 53, conductive material 53 being connected to a terminal TG'. Wall 49 extends from the front side of the structure across the entire thickness of three-layer assembly 33. Thus, transfer region 47 interrupts three-layer assembly 33 and is surrounded with a ring-shaped conductive wall 49, itself surrounded with three-layer assembly 33. Transfer region 47 comprises an extension 55 of substrate 31 covered with a heavily-doped N-type region 57 (N⁺).

Various transistors, for example, transistors RD, RST, and SF of FIG. 1 (transistor RD is not shown), are formed in SOI layer 39. On the front side of the structure, connections are formed towards N⁺ region 57 corresponding to node S of FIG. 1, towards P⁺ layer 35, and towards the drains, sources, and gates of the various transistors, the connection (not shown) towards P⁺ layer 35 interrupting SOI layer 39 and insulating layer 37.

A heavily-doped P-type layer 59 (P⁺) may be formed on the back side of substrate 31. In this embodiment, the back side of substrate 31 is coated with a filter 61 having the desired color for the considered pixel, for example, red, green, or blue. Further, filter 61 is coated with an optional lens 63 in this type of structure.

The operation of this pixel is the same as that described in U.S. Pat. No. 8,513,761 mentioned in relation with FIGS. 1 and 2.

Figure 2:
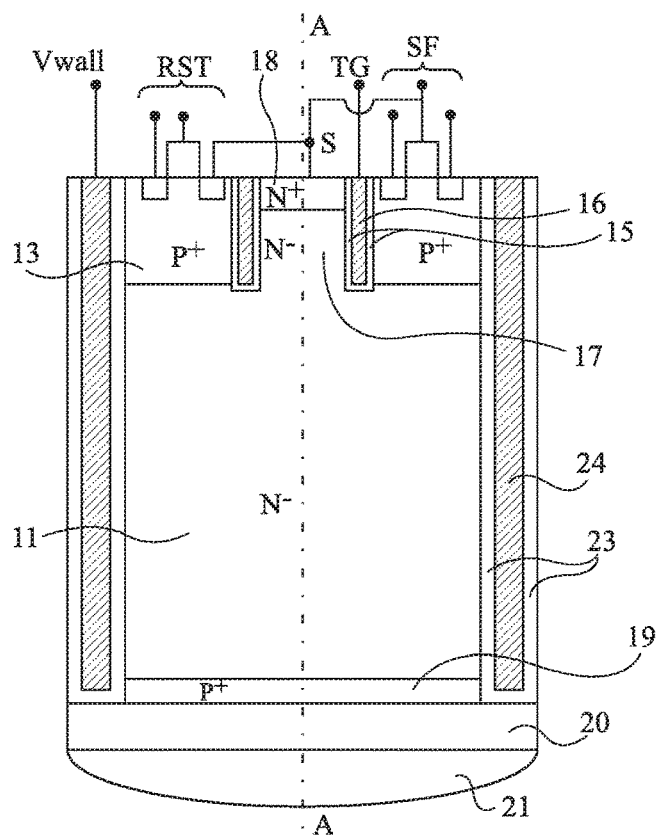
FIG. 2 is a cross-section view of an embodiment of the pixel of FIG. 1.

Advantageously, transistors RST, SF, and RD formed in SOI layer 39 of pixel 30 may operate at lower voltages and have less current leakage than in the case where they are formed in layer 13 of the pixel of FIG. 2.

The total surface area occupied by the transistors of pixel 30 may be smaller than that occupied by the transistors of the pixel of FIG. 2.

Further, the transistors of pixel 30 do not risk being disturbed by the charges photogenerated in the substrate, conversely to the case of the transistors of the pixel of FIG. 2.

As an example, substrate 31 is made of silicon. Substrate 31 may have a doping level in the range from $10^{14}$ to $10^{16}$ atoms·cm⁻³, for example, $10^{15}$ atoms·cm⁻³. Substrate 31 is thinned, for example, down to a thickness smaller than 10 μm, preferably in the range from 3 to 5 μm. N⁺ region 57 may have a doping level in the range from $10^{18}$ to $10^{21}$ atoms·cm⁻³. Region 57 may have a thickness in the range from 0.05 to 0.3 μm, for example, 0.015 μm. Region 55 may have a doping level approximately equal to that of substrate 31. The thickness of region 55 may be in the range from 0.3 to 1 μm, for example, 0.07 μm. Semiconductor layer 39 may have a thickness in the range from 20 to 300 μm, for example, 250 μm. P⁺ layer 59 may have a doping level in the order of $10^{18}$ atoms·cm⁻³. Region 59 may have a thickness in the range from 100 to 500 μm, for example, 300 μm. Conductive materials 53 and 45 may be doped polysilicon or a metal. Insulating materials 43 and 51 may correspond to a silicon oxide layer or to a succession of insulating layers, for example, made of silicon oxide, of silicon nitride, and of silicon oxide.

In practice, to manufacture pixel 30, a SOI-type structure comprising semiconductor layer 39 resting on insulating layer 37, itself resting on N⁻-doped semiconductor substrate 31, is provided. P⁺ layer 35 is formed by a step of deep implantation of dopant atoms followed by an anneal step, the central portion of the pixel corresponding to the transfer region being masked during the implantation step. Conductive walls 41 and 49 are formed by digging trenches at the location of walls 41 and 49, by etching the trenches from the front surface of semiconductor layer 39, by forming a layer of the insulating material, respectively 43 or 51, on the trench walls, and then by filling the trenches with the conductive material, respectively 43 or 53. Various transistors, for example, transistors RST, SF, and RD, are formed in semiconductor layer 39. Between insulated wall 49 and above a portion of layer 35 intended to be connected to the ground potential, semiconductor layer 39 and insulating layer 37 are then removed by etching all the way to substrate 31. A doping step is then carried out to form N⁺ upper portion 57 of transfer region 47. A step of siliciding the upper surfaces of the drains, of the sources, and of the gates of the transistors, while preferably avoiding siliciding N+ region 57 and the portion of P+ layer 35 which will be connected to a terminal of application of the ground potential, may then be carried out.

Interconnection levels are then formed above semiconductor layer 39 by successive steps of deposition and etching of insulating layers and of metal layers. It is desirable for the interconnection levels to be formed on a planar surface. To achieve this, prior to the forming of such interconnection levels, a planarized deposition should be performed in the opening crossing SOI layer 39 above transfer region 47. A step of filling with an insulator crossed by a conductive via may be provided.

Once the interconnection levels have been formed, a handle, for example, a silicon trench, is bonded to the upper surface of the interconnection stack, and substrate 31 is thinned on its back side down to a desired thickness. Finally, P+ layer 59 and possibly filter 61 and/or lens 63 are formed on the back side of substrate 31.

Advantageously, during the siliciding step, due to the fact that the transistors are formed in a semiconductor layer 39 insulated from substrate 31, risks of substrate contamination by metal atoms are decreased with respect to the case where the transistors are formed in P+ layer 13 of the pixel of FIG. 2.

Figure 4:
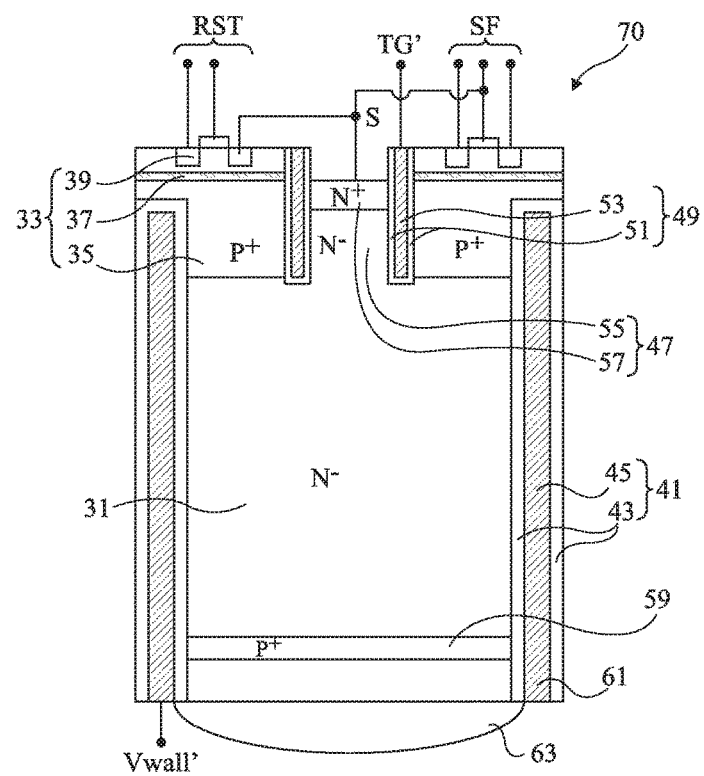
FIG. 4 is a cross-section view of an alternative embodiment of a pixel.

FIG. 4 is a cross-section view schematically showing an alternative embodiment of the pixel of FIG. 3. In this variation, a pixel 70 comprises the same elements designated with the same reference numerals as pixel 30, except that insulated conductive wall 41 laterally delimiting pixel 70 extends from the back side of the pixel all the way into P+ layer 35. Preferably, insulated conductive wall 41 extends all the way into insulating layer 37 of three-layer assembly 33.

The steps enabling to manufacture pixel 70 are the same as those enabling to manufacture pixel 30, except that the trench corresponding to wall 41 is etched from the back side of the pixel after the thinning of substrate 31.

Figure 5:
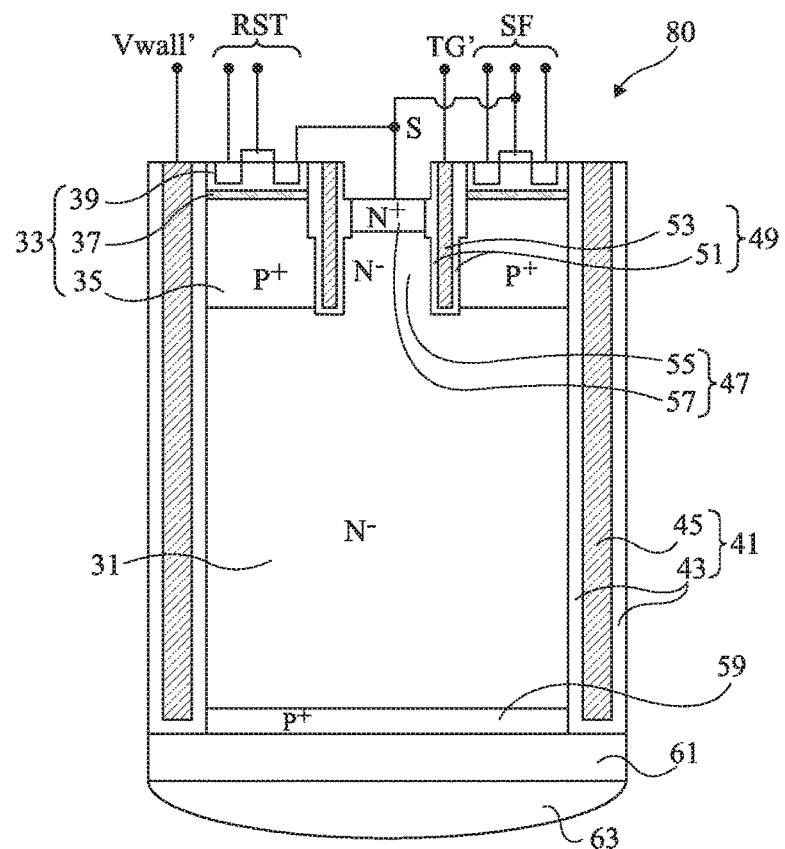
FIG. 5 is a cross-section view of another alternative embodiment of a pixel.

FIG. 5 is a cross-section view schematically showing another alternative embodiment of the pixel of FIG. 3. In this variation, a pixel 80 comprises the same elements designated with the same references as pixel 30, except that insulating material 51 of insulated conductive wall 49 is thicker in an upper portion of wall 49 extending all the way to a level equal to or lower than that of the lower surface of N+ region 57. As a result, the influence of the biasing of conductive material 53 of wall 49 on N+ region 57, and thus on sense node S, as well as on the transistors formed in SOI layer 39, may be decreased with respect to the case of pixels 30 and 70.

To form conductive wall 49 of pixel 80, prior to the etching of the trench corresponding to wall 49, an insulating region made of insulating material 51 is formed at the location of wall 41, for example, by etching a trench and then by filling this trench with insulating material 51. This insulating region extends from the upper surface of the semiconductor layer to a level equal to, preferably lower than, that of the lower surface of N+ region 57. Further, in top view, the insulating region has a width greater than that of conductive wall 49 which will be subsequently formed. Wall 49 is then formed as described in relation with FIG. 3.

Specific embodiments have been described. Various alterations, modifications, and improvements will occur to those skilled in the art. In particular, although an embodiment where electrons are stored has been described, it will be within the abilities of those skilled in the art to adapt the previously-described pixels to the case where holes are stored by inverting all conductivity types and by adapting the potentials applied to the various regions of the pixels.

Although pixels laterally delimited by an insulated conductive wall 41 have been described, other insulating structures may be provided to delimit these pixels, for example, a heavily-doped P-type wall (P+).

Read devices different from those described in relation with FIG. 1 may be provided in the above-described pixels. The transistors corresponding to these devices will be formed in SOI layer 39.

The order and the number of steps of the previously-described pixel manufacturing methods may be adapted by those skilled in the art.

Figure 6:
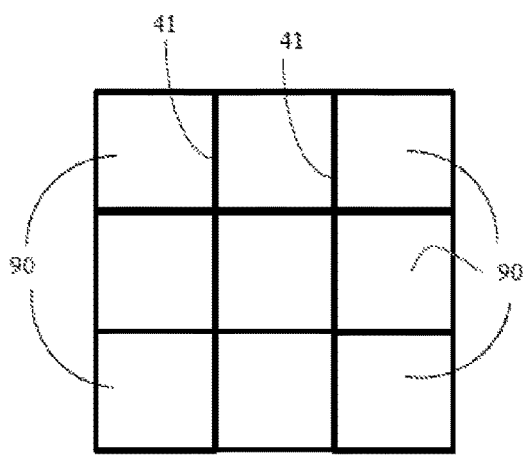
FIG. 6 is a schematic diagram of an image sensor including an array of pixels.

Shown schematically in FIG. 6 is an image sensor that includes an array of pixels 90, each of which may be implemented by one of the pixels 30, 70, 80 shown in FIGS. 3-5. FIG. 6 shows the insulated conductive walls 41 delimiting the pixels 90 from each other.

It should be noted that those skilled in the art may combine various elements of the various embodiments and variations described herein without showing any inventive step.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A device, comprising:
 a back side illuminated pixel, including:
  a semiconductor substrate of a first conductivity type;
  a stack that includes:
   a semiconductor region of a second conductivity type formed in the substrate;
   an insulating layer; and
   a semiconductor layer, the insulating layer being positioned between the semiconductor region and the semiconductor layer;
  a transfer region of the first conductivity type between first and second portions of the stack that each include the semiconductor region, insulating layer, and semiconductor layer, the transfer region being in a central portion of the back side illuminated pixel;
  transistors formed in the semiconductor layer;
  a first wall delimiting the semiconductor substrate laterally, the first wall extending from a front side of the semiconductor substrate to a back side of the semiconductor substrate; and
  a filter on the back side of the semiconductor substrate and on an edge of the first wall.
2. The device of claim 1, comprising a second wall that laterally delimits the transfer region and is positioned between the transfer region and the semiconductor region, insulating layer, and semiconductor layer.

3. The device of claim 2 wherein the second wall comprises a conductive material and an insulator bordering the conductive material.

4. The device of claim 3 wherein the second wall is configured to be connected to a first potential and allow a charge transfer through the transfer region when connected to the first potential, and is configured block the charge transfer through the transfer region when connected to a second potential.

5. The device of claim 2 wherein the second wall extends from the front side of the semiconductor substrate to an end of the transfer region.

6. The device of claim 1 wherein the transfer region comprises an extension of the semiconductor substrate and a heavily-doped region of the first conductivity type.

7. The device of claim 6 wherein the first wall comprises a conductive material and an insulator bordering the conductive material.

8. The device of claim 1, further comprising a contact formed on the semiconductor region.

9. The device of claim 1, further comprising a heavily-doped semiconductor layer of the second conductivity type between the back side of the substrate and the filter.

10. A method, comprising:
manufacturing a pixel, the manufacturing including:
forming, at a front side of a semiconductor substrate of a first conductivity type, a semiconductor region of the second conductivity type, the semiconductor substrate being part of a structure that includes an insulation layer on the semiconductor substrate and a semiconductor layer on the insulating layer, the insulating layer being positioned between the semiconductor region and the semiconductor layer, the forming the semiconductor region including:
masking a central region of the structure; and
doping the substrate to form the semiconductor region extending under the insulating layer while the central region is masked;
forming a transfer region of the first conductivity type interrupting the semiconductor region, insulating layer, and semiconductor layer in a central portion of the pixel;
forming transistors in the semiconductor layer;
forming a first wall delimiting the semiconductor substrate laterally, the first wall extending from the front side of the semiconductor substrate to a back side of the semiconductor substrate; and
forming a filter on the back side of the semiconductor substrate and on an edge of the first wall.

11. The method of claim 10 wherein manufacturing the pixel includes:
forming a second wall extending from the front side of the semiconductor substrate completely through the semiconductor region, the insulating layer, and the semiconductor layer, the second wall delimiting the transfer region.

12. The method of claim 11 wherein forming the transfer region includes:
removing by etching central portions of the semiconductor layer and the insulating layer; and
doping an upper portion of the substrate in the central region of the structure to a higher doping level than a doping level of an underlying portion of the substrate in the central region.

13. The method of claim 10 wherein manufacturing the pixel includes:
forming interconnection levels on an upper surface of the semiconductor layer;
attaching a handle above the interconnection levels; and
thinning a back side the substrate.

14. An image sensor, comprising:
a semiconductor substrate of a first conductivity type; and
a plurality of pixels, each pixel including:
a semiconductor region of a second conductivity type;
an insulating layer;
a semiconductor layer, the insulating layer being positioned between the semiconductor region and the semiconductor layer, the semiconductor region, insulating layer, and semiconductor layer being orientated vertically with respect to each other;
a transfer region of the first conductivity type in a central portion of the pixel, the semiconductor region, insulating layer, and semiconductor layer completely laterally surrounding the transfer region;
transistors formed in the semiconductor layer;
a first wall through the semiconductor substrate delimiting a first lateral side of the pixel;
a second wall through the semiconductor substrate delimiting a second lateral side of the pixel; and
a filter on a back side of the semiconductor substrate and on respective edges of the first and second walls.

15. The image sensor of claim 14, wherein each pixel includes:
an insulating structure that laterally delimits the transfer region of the pixel from the semiconductor region, insulating layer, and semiconductor layer of the pixel.

16. The image sensor of claim 15 wherein the insulating structure includes an insulator surrounding a conductive layer.

17. The image sensor of claim 15 wherein, in each pixel, the first semiconductor layer, the insulating layer, and the second semiconductor layer each directly contact the insulating structure of the pixel.

18. The image sensor of claim 14 wherein each transfer region comprises an extension of the substrate and a heavily-doped region of the first conductivity type.

19. The image sensor of claim 14 wherein each of the first and second walls includes an insulator surrounding a conductive layer.

20. A method, comprising:
manufacturing a pixel, the manufacturing including:
forming, at a front side of a semiconductor substrate of a first conductivity type, a semiconductor region of a second conductivity type, the semiconductor substrate being part of a structure that includes an insulating layer on the semiconductor substrate and a semiconductor layer on the insulating layer, the insulating layer being positioned between the semiconductor region and the semiconductor layer;
forming a transfer region of the first conductivity type interrupting the semiconductor region, insulating layer, and semiconductor layer in a central portion of the pixel, the forming the transfer region including:
removing by etching central portions of the semiconductor layer and the insulating layer; and
doping an upper portion of the substrate in the central region of the structure to a higher doping level than a doping level of an underlying portion of the substrate in the central region;
forming transistors in the semiconductor layer;
forming a first wall delimiting the semiconductor substrate laterally, the first wall extending from the front side of the semiconductor substrate to a back side of the semiconductor substrate; and forming a filter on the back side of the semiconductor substrate and on an edge of the first wall.

21. The method of claim 20 wherein manufacturing the pixel includes:

forming a second wall extending from the front side of the semiconductor substrate completely through the semiconductor region, the insulating layer, and the semiconductor layer, the second wall delimiting the transfer region.

* * * * *